US007129531B2

(12) United States Patent
Fournier et al.

(10) Patent No.: US 7,129,531 B2
(45) Date of Patent: Oct. 31, 2006

(54) PROGRAMMABLE RESISTANCE MEMORY ELEMENT WITH TITANIUM RICH ADHESION LAYER

(75) Inventors: Jeffrey P. Fournier, Livonia, MI (US); Sergey A. Kostylev, Bloomfield Hills, MI (US)

(73) Assignee: Ovonyx, Inc., Rochester Hills, MI (US)

( * ) Notice: Subject to any disclaimer, the term of this patent is extended or adjusted under 35 U.S.C. 154(b) by 368 days.

(21) Appl. No.: 10/442,877

(22) Filed: May 21, 2003

(65) Prior Publication Data

US 2004/0026731 A1 Feb. 12, 2004

Related U.S. Application Data

(63) Continuation-in-part of application No. 10/215,315, filed on Aug. 8, 2002, now Pat. No. 6,872,963.

(51) Int. Cl.
H01L 27/10 (2006.01)
H01L 29/73 (2006.01)
H01L 29/74 (2006.01)
H01L 29/768 (2006.01)
H01L 27/148 (2006.01)

(52) U.S. Cl. ............... 257/209; 257/225; 257/226; 257/227; 257/228; 257/229; 257/230; 257/231; 257/232; 257/233; 257/234; 257/390; 257/391; 257/529; 257/530; 257/758; 257/760; 257/770; 257/774

(58) Field of Classification Search ............... 257/209, 257/225–234, 390–391, 529–530, 758, 763, 257/770, 774
See application file for complete search history.

(56) References Cited

U.S. PATENT DOCUMENTS

| | | | |
|---|---|---|---|
| 5,166,758 A * | 11/1992 | Ovshinsky et al. ............ 257/3 |
| 5,486,707 A * | 1/1996 | Look et al. ................... 257/52 |
| RE37,259 E * | 7/2001 | Ovshinsky .................. 365/163 |
| 6,693,821 B1 * | 2/2004 | Hsu et al. .................... 365/158 |
| 6,759,249 B1 * | 7/2004 | Zhuang et al. ................. 438/3 |
| 6,787,843 B1 * | 9/2004 | Tempel ....................... 257/315 |
| 6,897,517 B1 * | 5/2005 | Van Houdt et al. ......... 257/315 |
| 2002/0038883 A1 * | 4/2002 | Lowrey et al. ............. 257/314 |
| 2002/0064911 A1 * | 5/2002 | Eitan .......................... 438/216 |
| 2002/0118566 A1 * | 8/2002 | Jong et al. ............. 365/185.03 |
| 2002/0197566 A1 * | 12/2002 | Maimon et al. ............ 430/314 |
| 2003/0049912 A1 * | 3/2003 | Campbell et al. ........... 438/385 |
| 2004/0099215 A1 * | 5/2004 | Danek et al. ............. 118/723 E |

* cited by examiner

*Primary Examiner*—Ida M. Soward
(74) *Attorney, Agent, or Firm*—Philip H. Schlazer; Marvin S. Siskind

(57) ABSTRACT

A programmable resistance memory element comprising an adhesion layer between the programmable resistance material and at least one of the electrodes. Preferably, the adhesion layer is a titanium rich titanium nitride composition.

29 Claims, 5 Drawing Sheets

PROGRAMMABLE RESISTANCE MEMORY ELEMENT WITH TITANIUM RICH ADHESION LAYER

RELEATED APPLICATION INFORMATION

The present application is a continuation-in-part of U.S. patent application Ser. No. 10/215,315 filed on Aug. 8, 2002 now U.S. Pat. No. 6,872,963. U.S. patent application Ser. No. 10/215,315 is hereby incorporated by reference herein.

FIELD OF THE INVENTION

The present invention relates generally to electrically programmable memory elements. More specifically, the present invention relates to electrically programmable memory elements using programmable resistance materials.

BACKGROUND OF THE INVENTION

Programmable resistance memory elements formed from materials that can be programmed to exhibit at least a high or low stable resistance state are known in the art. Such programmable resistance elements may be programmed to a high resistance state to store, for example, a logic ZERO data bit. As well, they may be programmed to a low resistance state to store, for example, a logic ONE data bit.

One type of material that can be used as memory material for programmable resistance elements is phase change material. Phase change materials may be programmed between a first structural state where the material is generally more amorphous (less ordered) and a second structural state where the material is generally more crystalline (more order).

The concept of utilizing electrically programmable phase change materials for electronic memory applications is disclosed, for example, in U.S. Pat. Nos. 3,271,591 and 3,530,441, the contents of which are incorporated herein by reference. The higher energy requirements for programming the memory cells described in the '591 and '441 patents limited the use of these cells as a direct and universal replacement for present computer memory applications. The programming energy requirements of a programmable resistance memory element may be reduced in different ways. For example, the programming energies may be reduced by the appropriate selection of the composition of the memory material. An example of a phase change material having reduced energy requirements is described in U.S. Pat. No. 5,166,758, the disclosure of which is incorporated by reference herein. Other examples of memory materials are provided in U.S. Pat. Nos. 5,296,716, 5,359,712 and 6,087,674 the disclosures of which are all hereby incorporated by reference herein.

SUMMARY OF THE INVENTION

One aspect of the present invention is an electrically programmable memory element, comprising: a programmable resistance material; a conductive material; an additional material between said programmable resistance material and said conductive material, said additional material comprising titanium and nitrogen, wherein the atomic percent of said titanium is greater than the atomic percent of said nitrogen.

Another aspect of the present invention is an electrically programmable memory element, comprising: a programmable resistance material; a conductive material; an additional material between said conductive material and said programmable resistance material, said additional material comprising titanium, nitrogen and a third element, wherein the sum of the atomic percent of said titanium and the atomic percent of said third element is greater than the atomic percent of said nitrogen.

DETAILED DESCRIPTION OF THE INVENTION

In the following paragraphs and association with the accompanying figures, examples of memory elements formed according to embodiments of the invention are presented. Specific embodiments of the memory elements and methods of making such memory elements are described as they might be implemented for use in semiconductor memory circuits. In the interest of clarity, not all features of an actual implementation are described in this specification.

The present invention is directed to programmable resistance memory elements. The memory element includes a memory material. The memory material includes a programmable resistance material which is programmable between at least a first resistance state and a second resistance state in response to an electrical signal. The electrical signal is preferably a controlled electrical current such as from a current source. The memory element further comprises one or more electrodes in electrical communication with the programmable resistance material. The one or more electrodes provide the electrical signal to the programmable resistance material.

Figure 1:
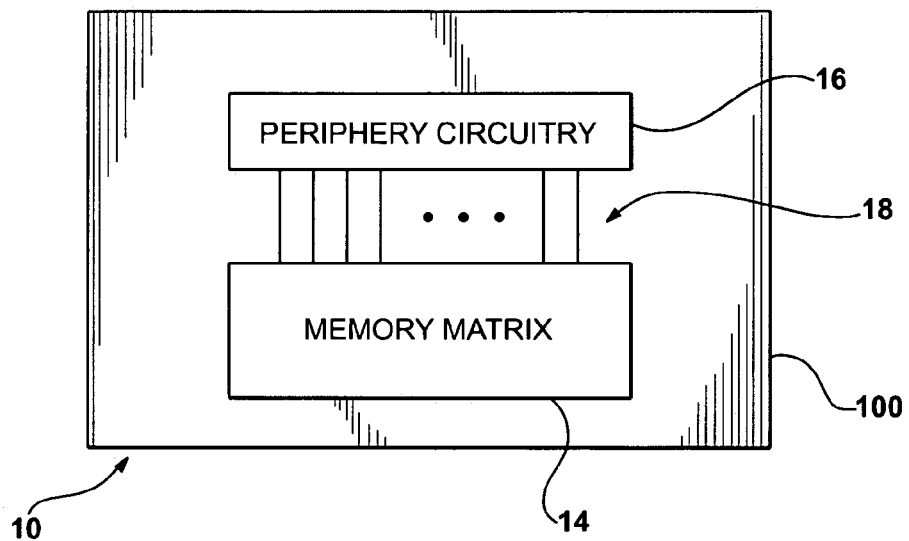
FIG. 1 shows a high-level diagram of a memory device of the present invention including a memory array and periphery circuitry formed on a substrate.

Turning now to the drawings, and referring initially to FIG. 1, a memory device is illustrated and generally designated by a reference number 10. The memory device 10 is an integrated circuit formed on a semiconductor substrate 100. The memory device 10 includes a memory matrix or array 14 that includes a plurality of memory cells for storing data. The memory matrix 14 is coupled to periphery circuitry 16 by the plurality of control lines 18. The periphery circuitry 16 may include circuitry for addressing the memory cells contained within the memory array 14, along with circuitry for storing data in and retrieving data from the memory cells. The periphery circuitry 16 may also include other circuitry used for controlling or otherwise insuring the proper functioning of the memory device 10.

A top view of the memory array 14 is shown in FIG. 102A. As can be seen, the memory array includes a plurality of memory cells 20 that are arranged in rows and columns. The memory cells 20 in each row are coupled together by a respective wordline 22, and the memory cells 20 in each column are coupled together by a respective bitline 24.

Figure 2A:
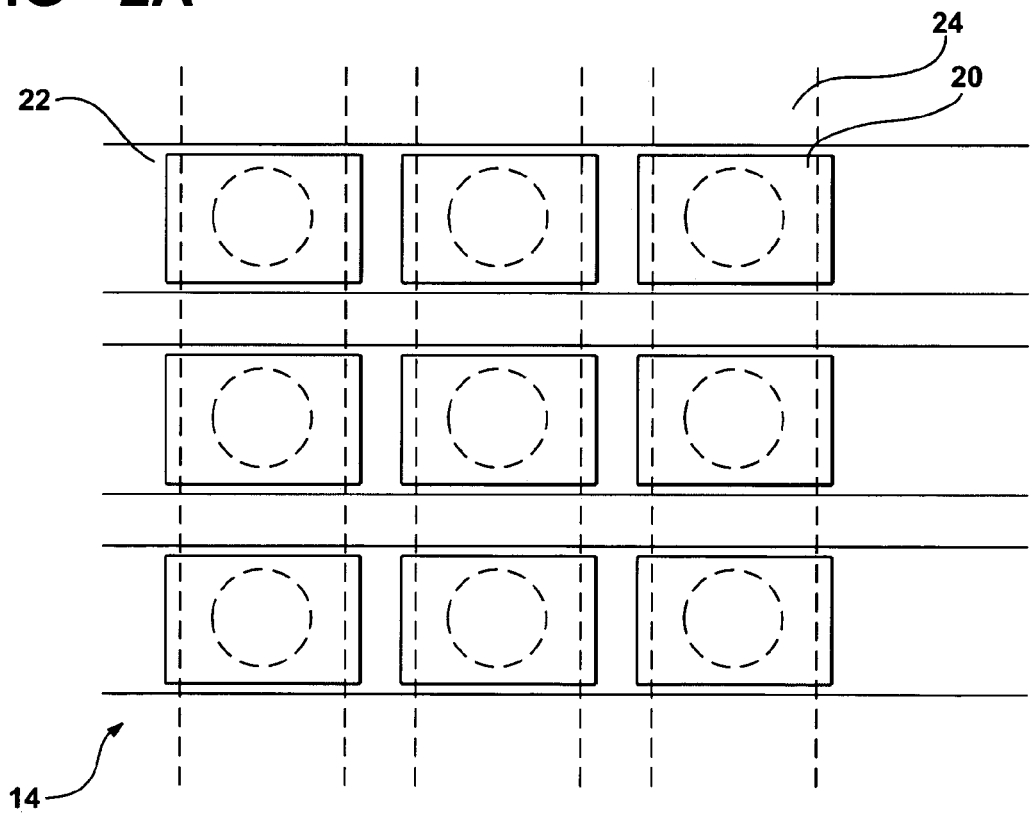
FIG. 2A shows a high-level diagram of a memory array of the present invention.
Figure 2B:
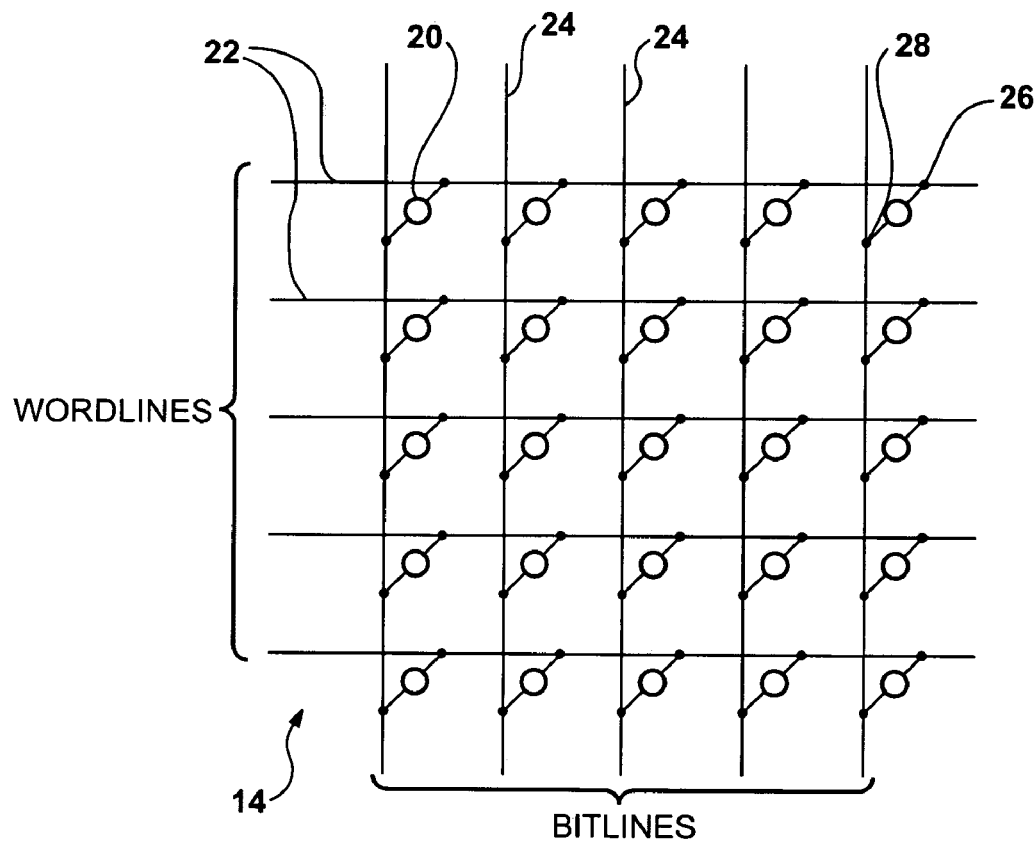
FIG. 2B is a schematic diagram of a memory array of the present invention.

A schematic diagram of the memory array 14 is shown in FIG. 2B. Each memory cell 20 includes a wordline node 26 that is coupled to a respective wordline 22, and each memory cell 20 includes a bitline node 28 that is coupled to a respective bitline 24. The conductive wordlines 22 and bitlines 24 are collectively referred to as address lines. These address lines are electrically coupled to the periphery circuitry 16 (shown in FIG. 1) so that each of the memory cells 20 can be accessed for the storage and retrieval of information.

Figure 3:
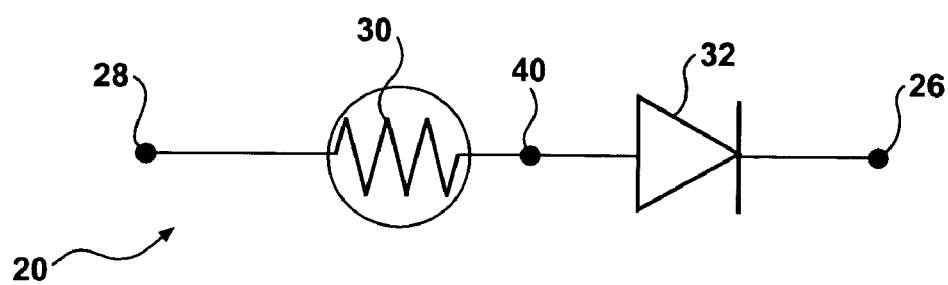
FIG. 3 is a schematic diagram of a memory cell incorporating a programmable resistance material.

FIG. 3 illustrates an exemplary memory cell 20 that may be used in the memory array 14. The memory cell 20 includes a memory element 30 which is coupled to an access device 32. The access device electrically isolates each memory element from all other memory elements in the array. In this embodiment, the memory element 30 is illustrated as a programmable resistance element and the access device 32 is illustrated as a diode. The programmable resistive element may be made of a chalcogenide material (that is, a material that includes at least one chalcogen element), as will be more fully explained below. As illustrated in FIG. 3, the memory element 30 is coupled to a bitline node 28 (and to bitline 24), and the access device 32 is coupled to a wordline node 26 (and to wordline 22). However, it should be understood that connections of the memory element 20 may be reversed without adversely affecting the operation of the memory array 14.

Figure 4A:
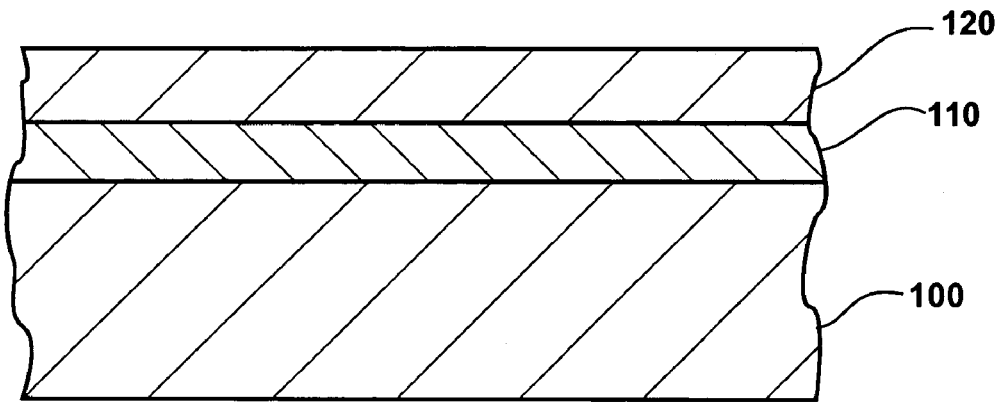
FIGS. 4A–4C show a process for making an embodiment of a programmable resistance memory element of the present invention.
Figure 4B:
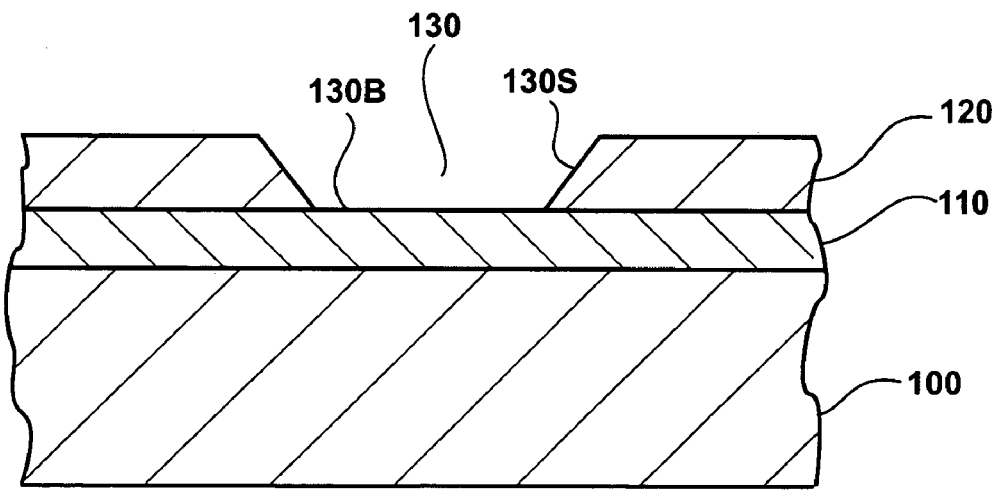
Figure 4C:
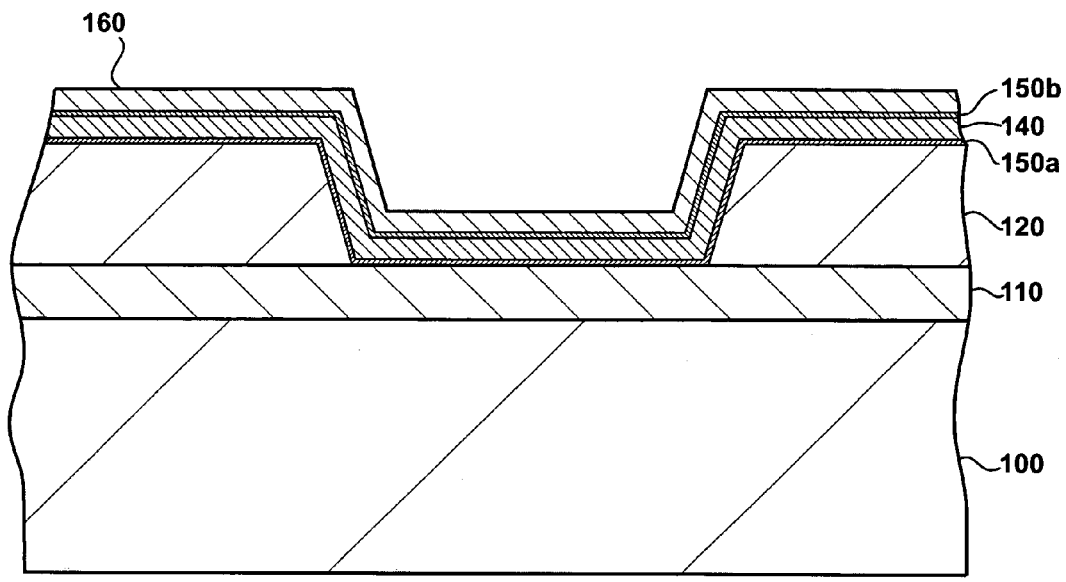

A structure of an exemplary memory cell 20 is illustrated in FIG. 4C, while a method for fabricating the memory cell 20 is described with reference to FIGS. 4A–4C. Is should be understood that while the fabrication of only a single memory cell 20 is discussed below, a plurality of similar memory cells may be fabricated simultaneously. Although not illustrated, each memory cell is electrically isolated from other memory cells in the array in any suitable manner, such as by the addition of embedded field oxide regions between each memory cell.

Referring first to FIG. 4A, a semiconductor substrate 100 is provided. The substrate 100 may include the access devices as well as the bitlines and/or wordlines. A layer 110 of a conductive material is formed on top of the substrate 100. The layer 110 of the conductive material forms a first electrode for the memory element (in this case the first electrode is a bottom electrode for the memory element). The conductive material used for layer 110 may be any conductive material. Examples of materials which may be used for layer 110 include, but are not limited to, n-type doped polysilicon, p-type doped polysilicon, p-type doped silicon carbon alloys and/or compounds, n-type doped silicon carbon alloys and/or compounds, titanium-tungsten, tungsten, tungsten silicide, molybdenum, titanium nitride, titanium carbon-nitride, titanium aluminum-nitride, titanium silicon-nitride, and carbon.

A dielectric material 120 is formed on top of the conductive layer 110. The dielectric layer 120 may be comprised of any suitable dielectric material, such as silicon nitride or silicon dioxide. The dielectric layer 120 may be formed in any suitable manner, such as by chemical vapor deposition (CVD).

Referring to FIG. 4B, an opening 130 (also referred as a "window") is formed through the dielectric layer 120 to expose a portion of the underlying conductive layer 110. Generally, the opening 130 may be any shape. For example, the opening 130 may be formed as a hole (such as a substantially circular or rectangular hole). Alternately, the opening 130 may be formed as a trench. The opening 130 includes the sidewall surface 130S about the periphery of the opening and the bottom surface 130B. The opening 130 is preferably a substantially circular hole.

Any suitable method of forming the opening 130 may be used. For example, using standard photolithographic techniques, a hard mask (not shown) may be deposited on top of the dielectric layer 120 and patterned in the size and shape of the resulting opening 130. Hence, in one embodiment, the opening may be sized at the photolithographic limit. Alternately, in another embodiment, it is possible that the opening 130 be formed so that one or more of its lateral dimensions are less than the photolithographic dimension. In yet another embodiment, it is possible that top of the opening 130 may be sized at the photolithographic limit while the bottom of the opening has one or more lateral dimensions which are sized at or below the photolithographic limit.

Referring to FIG. 4C, a first adhesion layer 150a is then deposited into the opening 130. In the example shown, the adhesion layer 150a deposited onto the conductive layer 110 (the bottom electrode) as well as onto the sidewall and top surfaces of the dielectric layer 120. A programmable resistance material layer 140 is then deposited onto the adhesion layer 150a. A second adhesion layer 150b is then deposited onto the programmable resistance material layer 140. A conductive layer 160 is then formed on the second adhesion layer 150b. The conductive layer 160 serves as the second electrode (in this case the top electrode) for the memory element. The conductive layer 160 may be formed of the same materials as the conductive layer 110. The top and bottom electrodes are used to provide an electrical signal to the programmable resistance material. The same materials may be used to form the first and second adhesion layers 150a,b. Alternately, each of the adhesion layers may have a different composition.

Figure 5:
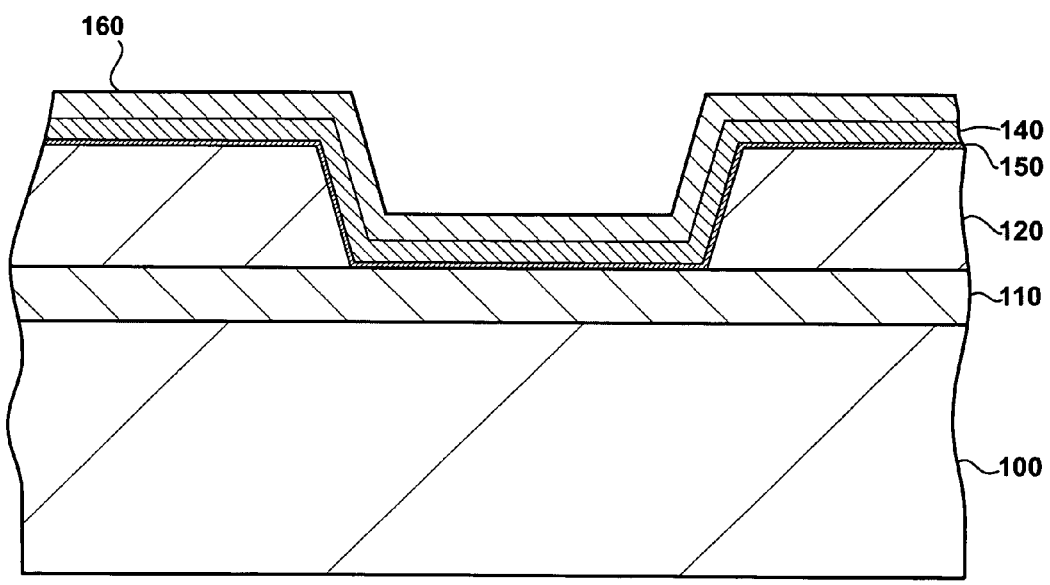
FIG. 5 shows an alternate embodiment of the present invention with an adhesion layer between the bottom electrode and the programmable resistance material.
Figure 6:
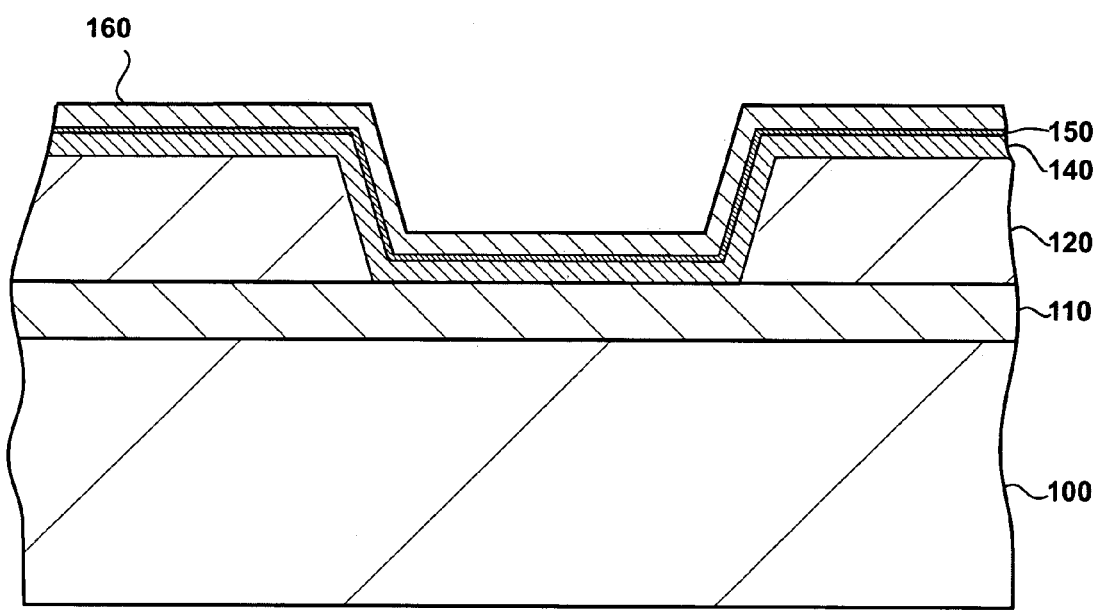
FIG. 6 shows an alternate embodiment of the present invention with an adhesion layer between the top electrode and the programmable resistance material.

In the embodiment of the invention shown in FIG. 4C, an adhesion layer is on both sides of the programmable resistance material. The first adhesion layer 150a is disposed between the bottom electrode 110 and the programmable resistance material 140 (as well as between the dielectric material 120 and the programmable resistance material 140) while the second adhesion layer 150b is disposed between the top electrode 160 and the programmable resistance material 140. Hence, the first adhesion layer 150a is adjacent to the bottom electrode 110 while the second adhesion layer 150b is adjacent to the top electrode 160. Other embodiments are, of course, possible where an adhesion layer is disposed between the programmable resistance material and only one of the electrodes. As shown in FIG. 5, a adhesion layer 150 may be disposed between the bottom electrode 110 and the programmable resistance material 140 (as well as between the dielectric layer 120 and the programmable resistance material 140) but not between the top electrode 160 and the programmable resistance material 140. Likewise, as shown in FIG. 6, an adhesion layer 150 may be disposed between the top electrode 160 and the programmable resistance material 140 but not between the bottom electrode 110 and the programmable resistance material 140 (and not between the dielectric material 120 and the programmable resistance material 140).

The adhesion layers are formed from one or more materials. The materials that form the adhesion layers are referred to as adhesion materials. An example of an adhesion material is a composition (such as an alloy or compound) comprising the elements titanium and nitrogen. Preferably, the atomic percent of titanium atoms is greater than the atomic percent of the nitrogen atoms. Moreover, the atomic percent of titanium atoms is preferably at least 5% greater, more preferably at least 15% greater, and most preferably at least 25% greater that the atomic percent of the nitrogen atoms. The composition may be a binary composition consisting essentially of titanium and nitrogen. An example of this type of composition is a titanium rich titanium nitride composition. The titanium rich titanium nitride may be formed by adjusting the nitrogen gas flow during sputter deposition.

It is believed that the titanium rich titanium nitride composition acts as an excellent barrier material preventing foreign materials from entering the programmable resistance material. In addition, it is believed that the titanium rich titanium nitride also promotes adhesion between the electrodes and the programmable resistance material. While not wishing to be bound by theory, it is believed that a portion of the titanium atoms in the titanium rich titanium nitride may react with the programmable resistance material. The programmable resistance material is preferably a chalcogenide material that includes at least one chalcogen element such as the element tellurium. Some of the titanium atoms in the titanium rich titanium nitride may react with the tellurium atoms of the chalcogenide to from a titanium telluride compound. The titanium telluride promotes adhesion between the conductive material of the electrode and the chalcogenide material.

Another example of an adhesion material is a composition (such as a compound or alloy) comprising titanium, nitrogen and a third element. Preferably, the sum of the atomic percent of the titanium and the atomic percent of the third element is greater than the atomic percent of the nitrogen. Moreover, the sum of the atomic percent of the titanium and the atomic percent of the third element is preferably at least 5% greater, more preferably at least 15% greater, and most preferably at least 25% greater that the atomic percent of the nitrogen atoms. The composition may be a ternary compound consisting essentially of titanium, nitrogen and this third element. The third element may be a metallic element or a non-metallic element. An example of a metallic element which may be used is aluminum. An example of a non-metallic element which may be used is silicon.

The adhesion material is preferably a nitride. However, it is also possible that the adhesion material may be an oxide, sulfide, flouride, chloride, carbide, oxynitride, caroxynitride, boride or phosphide.

The thickness of one or more of the adhesion layers is preferably less than about 75 Angstroms. The thickness is more preferably between about 10 to about 60 Angstroms and, most preferably, between about 15 to about 50 Angstroms. Two or more of the adhesion layers may have different thicknesses.

As noted, the programmable resistance material is preferably a phase change material, and, more preferably, a chalcogenide material (materials which include at least one of the chalcogen elements such as Te and/or Se). Examples of chalcogenide materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein.

In addition to including at least one of the chalcogen elements, the phase change material may further include at least one element selected from the group consisting of Ge, Sb, Bi, Pb, Sn, As, S, Si, P, and O. In one embodiment, the phase change material comprises the elements Te, Ge and Sb. In another embodiment, the phase change material consists essentially of the elements Te, Ge and Sb. An example of a phase change material which may be used is $Ge_2Sb_2Te_5$.

The phase change material may include at least one transition metal element. The term "transition metal element" as used herein include the elements 21 to 30, 39 to 48, 57 and 72 to 80 from the periodic table. Preferably, the one or more transition metal elements are selected from the group consisting of Cr, Fe, Ni, Nb, Pd, and Pt. The phase change materials which include transition metal elements may be elementally modified forms of the phase change materials in the Te—Ge—Sb ternary system. This elemental modification may be achieved by the incorporation of transition metals into the basic Te—Ge—Sb ternary system, with or without an additional chalcogen element, such as Se. The programmable resistance material layer may have a thickness of about 600 Angstroms.

In addition to the programmable resistance material layer and one or more adhesion layers, the memory element of the present invention further includes one or more electrodes which are in electrical communication with the programmable resistance material and which deliver an electrical signal to the programmable resistance material. Generally, the one or more electrodes may take any form. In the embodiments shown in FIGS. 4C, 5 and 6, the memory device includes two spacedly disposed electrodes.

The present invention is not limited to any of the particular electrode structures shown in FIGS. 4C, 5 and 6. Examples of alternate electrode structures are described in U.S. Pat. Nos. 5,166,758, 5,296,716, 5,359,205, 5,406,509, 5,534,711 and 5,536,947 the disclosures of which are all incorporated by reference herein. An example of an electrode structure in which the electrode tapers to a peak is disclosed in U.S. Patent No. RE37,259, the disclosures of which are both incorporated by reference herein. At least one of the electrodes (preferably, the bottom electrode) may be in the form of a conductive sidewall layer. For example, the bottom electrode may be a conductive liner or a conductive spacer. Examples of this type of electrode structure are shown in U.S. patent application Ser. Nos. 09/276,273, 09/620,318, 09/677,957 and 09/891,157, the disclosures of which are all herby incorporated by reference herein. In yet another embodiment, the memory element may include an electrode in the form of a field emitter that is positioned in close proximity to the memory material (in this case a second electrode may or may not be used). The emitter tip serves as a source of electrons. Generally, the adhesion layers of the present invention are applicable to all memory element structures.

The memory elements of the present invention may be electrically coupled to isolation/selection devices and to addressing lines in order to form a memory array. The isolation/addressing devices permit each discrete memory element to be read and written to without interfering with information stored in adjacent or remote memory element of the array. Generally, the present invention is not limited to the use of any specific type of isolation/addressing device. Examples of isolation/addressing devices include field-effect transistors, bipolar junction transistors, and diodes. Examples of field-effect transistors include JFET and MOSFET. Examples of MOSFET include NMOS transistors and PMOS transistors. Furthermore NMOS and PMOS may even be formed on the same chip for CMOS technologies.

Hence, associated with each memory element of a memory array structure is isolation/addressing device for that memory element thereby enabling that cell to be read and written without interfering with information stored in other adjacent or remote memory elements of the array.

The programmable resistance material may be programmed to at least first resistance state and a second resistance state. The first resistance state has a first resistance value while the second resistance state has a second resistance value different from the first resistance value. The programmable resistance material is preferably programmed by electrical signals (such as currents). In one embodiment, the programmable resistance material is programmable to two resistance states so that each of the memory elements is capable of storing a single bit of information. In another embodiment, the programmable resistance material is programmable to at least three resistance states so that each of the memory elements is capable of storing more than one bit of information. In yet another embodiment, the programmable resistance material is programmable to at least four resistance states so that each of the memory elements is capable of storing at least two bits of information. Hence, the programmable resistance material may have a range of resistance values which is sufficient to provide for the storage of more than two bits of information.

The programmable resistance materials may be directly overwritable so that they can be programmed from any one of their resistance states to any other of their resistance states without first having to be erased to a starting state. Preferably, the same programming pulse or pulses may be used to program the programmable resistance material to a specific resistance state regardless of its previous resistance state. (For example, the same current pulse or pulses may be used to program the material to its high resistance state regardless of its previous state). An example of a method of programming the memory element is provided in U.S. Pat. No. 6,075,719, the disclosure of which is incorporated by reference herein.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. An electrically programmable memory element, comprising:
    a programmable resistance material;
    a conductive material; and
    an additional material between said programmable resistance material and said conductive material, said additional material comprising titanium and nitrogen, wherein the atomic percent said titanium is at least 5% greater than the atomic percent of said nitrogen.

2. The memory element of claim 1, wherein the atomic percent of said titanium is at least 15% greater than the atomic percent of said nitrogen.

3. The memory element of claim 1, wherein the atomic percent of said titanium is at least 25% greater than the atomic percent of said nitrogen.

4. The memory element of claim 1, wherein said additional material consists essentially of said titanium and nitrogen.

5. The memory element of claim 1, wherein said additional material is a titanium nitride.

6. The memory element of claim 1, wherein said programmable resistance material is a phase-change material.

7. The memory element of claim 1, wherein said programmable resistance material comprises at least one chalcogen element.

8. The memory element of claim 1, wherein said additional material is in direct contact with said programmable resistance material.

9. The memory element of claim 8, wherein said additional material is in direct contact with said conductive material.

10. An electrical device, comprising:
    a chalcogenide material;
    a dielectric material; and
    an additional material between said chalcogenide material and said dielectric material, said additional material comprising titanium and nitrogen, wherein the atomic percent said titanium is at least 5% greater than the atomic percent of said nitrogen.

11. The device of claim 10, wherein the atomic percent of said titanium is at least 15% greater than the atomic percent of said nitrogen.

12. The device of claim 10, wherein the atomic percent of said titanium is at least 25% greater than the atomic percent of said nitrogen.

13. The device of claim 10, wherein said additional material consists essentially of said titanium and nitrogen.

14. The device of claim 10, wherein said additional material is a titanium nitride.

15. The device of claim 10, wherein said additional material is in direct contact with said chalcogenide material.

16. The device of claim 15, wherein said additional material is in direct contact with said dielectric material.

17. An electrical device, comprising:
    a chalcogenide material; and
    an additional material in direct contact with said chalcogenide material, said additional material comprising titanium and nitrogen, wherein the atomic percent said titanium is at least 5% greater than the atomic percent of said nitrogen.

18. The device of claim 17, wherein the atomic percent of said titanium is at least 15% greater than the atomic percent of said nitrogen.

19. The device of claim 17, wherein the atomic percent of said titanium is at least 25% greater than the atomic percent of said nitrogen.

20. The device of claim 17, wherein said additional material consists essentially of said titanium and nitrogen.

21. The device of claim 17, wherein said additional material is a titanium nitride.

22. An electrically programmable memory element, comprising:
    a programmable resistance material;
    a dielectric material; and
    an additional material between said programmable resistance material and said dielectric material, said additional material comprising titanium and nitrogen, wherein the atomic percent said titanium is at least 5% greater than the atomic percent of said nitrogen.

23. The memory element of claim 22, wherein the atomic percent of said titanium is at least 15% greater than the atomic percent of said nitrogen.

24. The memory element of claim 22, wherein the atomic percent of said titanium is at least 25% greater than the atomic percent of said nitrogen.

25. The memory element of claim 22, wherein said additional material consists essentially of said titanium and nitrogen.

26. The memory element of claim 22, wherein said additional material is a titanium nitride.

27. The memory element of claim 22, wherein said programmable resistance material is a phase-change material.

28. The memory element of claim 22, wherein said additional material is in direct contact with said programmable resistance material.

29. The memory element of claim 22, wherein said additional material is in direct contact with said dielectric material.

* * * * *